United States Patent
Ide (12)

(10) Patent No.: US 6,313,662 B1
(45) Date of Patent: *Nov. 6, 2001

(54) HIGH SPEED LOW VOLTAGE DIFFERENTIAL SIGNAL DRIVER HAVING REDUCED PULSE WIDTH DISTORTION

(75) Inventor: Satoshi Ide, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,157

(22) Filed: Dec. 18, 1998

(30) Foreign Application Priority Data

Jul. 10, 1998 (JP) .................................................. 10-195245

(51) Int. Cl.[7] ..................... H03K 19/094; H03K 19/0175
(52) U.S. Cl. ............................... 326/83; 326/86; 326/30; 326/82
(58) Field of Search ................................ 326/30, 82, 83, 326/86, 17, 121, 27

(56) References Cited

U.S. PATENT DOCUMENTS

| | | | |
|---|---|---|---|
| 5,105,107 | * | 4/1992 | Wilcox ..................................... 326/30 |
| 5,418,478 | * | 5/1995 | Van Brunt et al. ..................... 326/30 |
| 5,514,983 | * | 5/1996 | Yoshino ................................. 326/30 |
| 5,767,699 | * | 6/1998 | Bosnyak et al. ....................... 326/86 |
| 5,920,204 | * | 7/1999 | Bruno .................................... 326/86 |
| 5,977,796 | * | 11/1999 | Gabara ................................... 326/86 |
| 6,025,742 | * | 2/2000 | Chan ...................................... 326/86 |

FOREIGN PATENT DOCUMENTS 9-214314   8/1997   (JP) .

OTHER PUBLICATIONS

M. Iwanaga, "Summary of Signal and Operation of LVDS"; *Transistor Gijyutsu*, pp. 276–280, Jul. 1997.

Draft Standarad for Low–Voltage Differential Signals (LVDS) for Scalable Coherent Interface (SCI); *IEEE*, pp. 33–34, Nov. 1995.

* cited by examiner

*Primary Examiner*—Michael Tokar
*Assistant Examiner*—Steven S. Paik
(74) *Attorney, Agent, or Firm*—Staas & Halsey, LLP

(57) ABSTRACT

A driver circuit for transmitting a signal by switching the direction of a signal current which flows on a pair of transmission lines. The drains of field effect transistors having the opposite polarities are connected to each other so as to constitute first and second switches. One of differential driving signals is input to the gate terminal of each of the field effect transistors constituting the first switch, while the drain terminal is connected to one of the transmission line pair. The other of the differential driving signals is input to the gate terminal of each of the field effect transistors constituting the second switch, while the drain terminal is connected to the other of the transmission line pair.

13 Claims, 13 Drawing Sheets

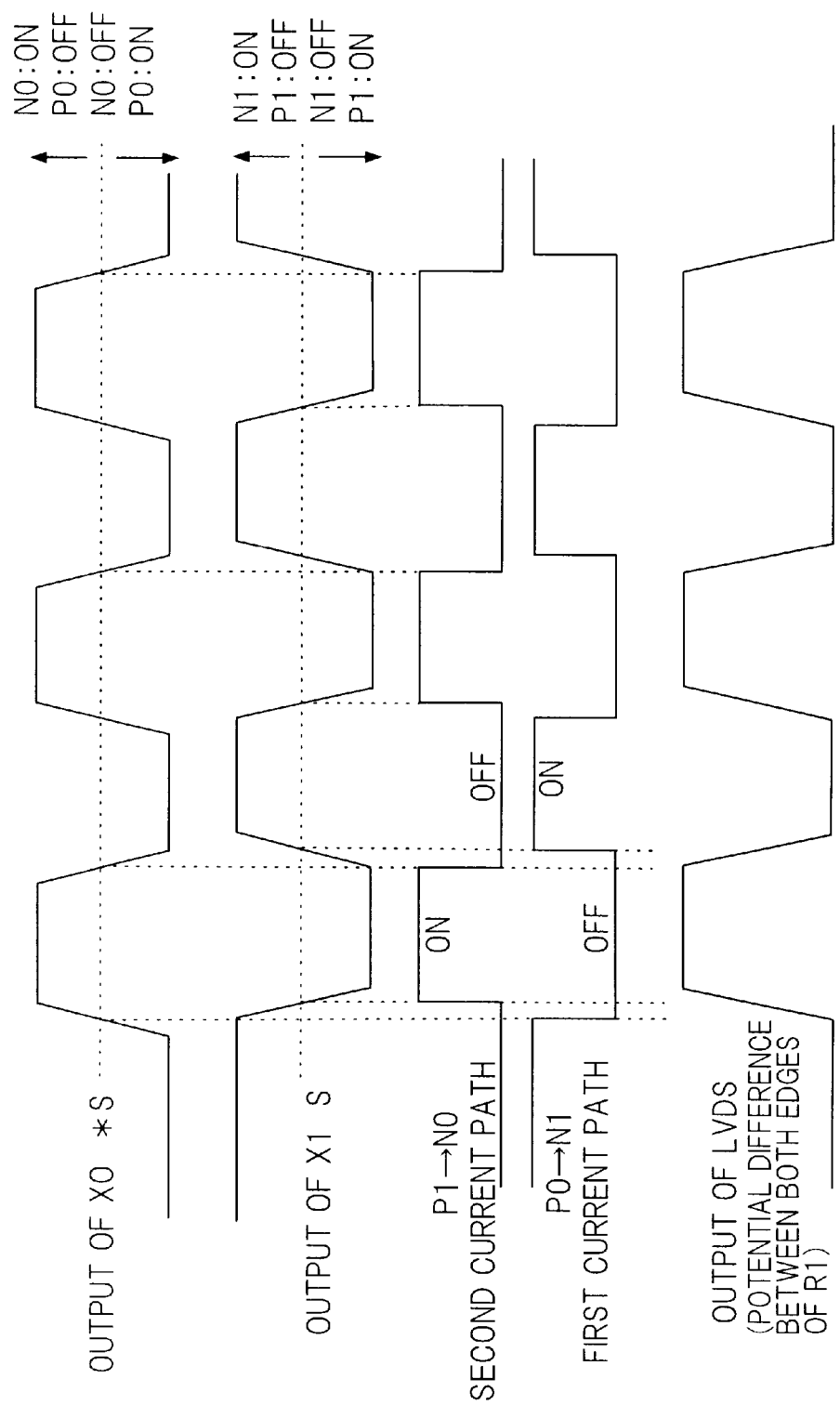

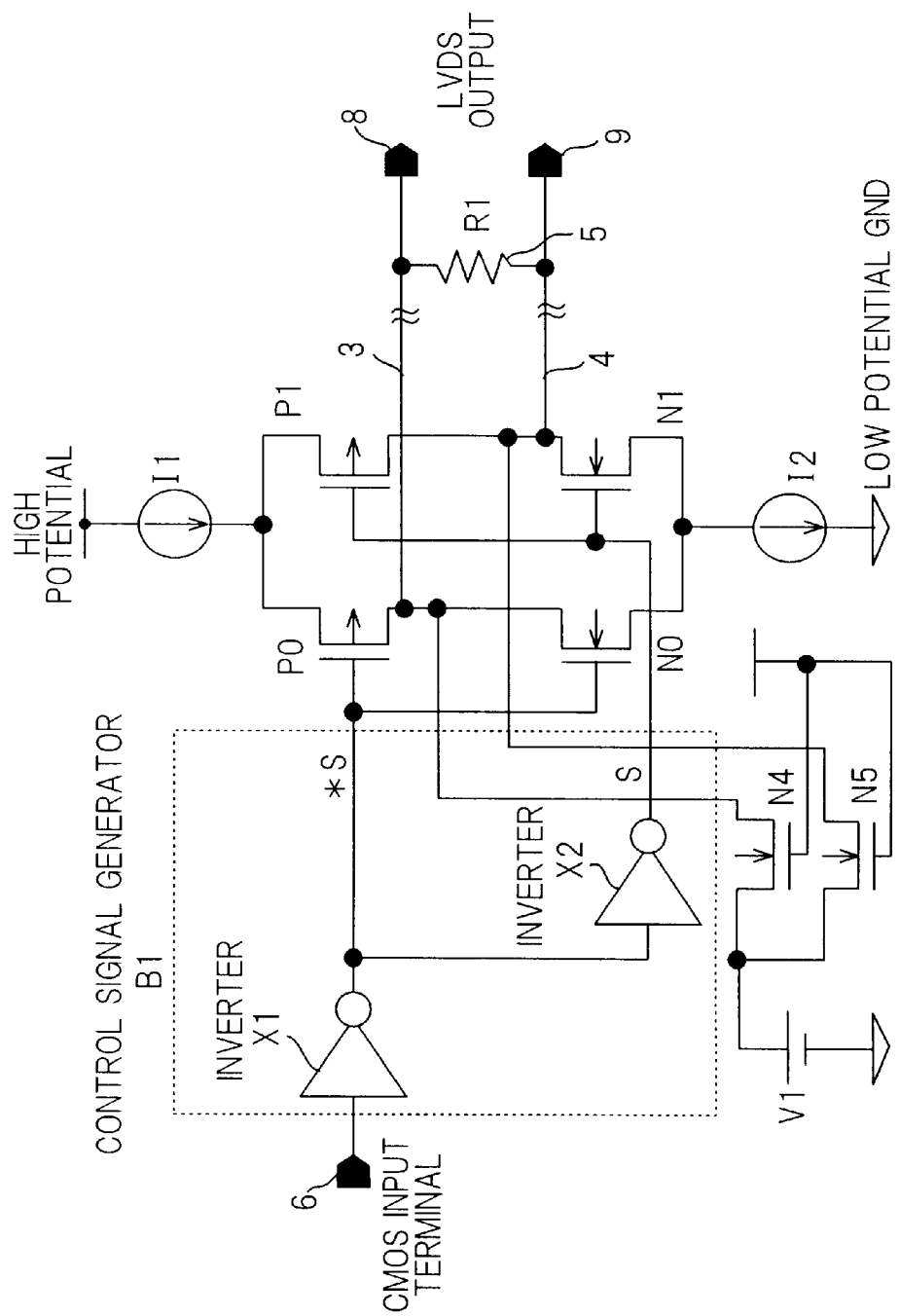

HIGH SPEED LOW VOLTAGE DIFFERENTIAL SIGNAL DRIVER HAVING REDUCED PULSE WIDTH DISTORTION

BACKGROUND OF THE INVENTION

The present invention relates to a driver circuit for transmitting a signal by switching the direction of the current which flows on a pair of transmission lines and, more particularly, to a driver circuit used for an interface for transmitting a small-amplitude signal at a high speed.

Recently, attention has been attracted on an LVDS (Low Voltage Differential Signal) interface for transmitting a small-amplitude differential signal.

FIG. 12 shows the structure of an LVDS interface. A driver 1 and a receiver 2 is combined by an upward transmission line 3 and a downward transmission line 4 each having a characteristic impedance of 50 Ω. The transmission lines 3, 4 are terminated by a resistor 5 of 100 Ω at the input end of the receiver 2. The driver 1 drives a current of about 3 mA and produces a voltage of about 300 mV at the terminating resistor 5.

The upward transmission line 3 and the downward transmission line 4 constitute what is called balanced transmission lines which have the same electrical characteristics. The leading characteristic of the LVDS interface is that one signal is transmitted through these balanced of transmission lines. The driver 1 generates a differential signal which produces a potential difference between the upward transmission line 3 and the downward transmission line 4 on the basis of a signal input from an input terminal 6. In contrast, the receiver 2 converts the differential signals generated between the upward transmission line 3 and the downward transmission line 4 into a signal of a CMOS level and outputs this signal from an output terminal 7.

The principle of the LVDS interface is that a signal is transmitted by generating a signal voltage at the terminating resistor 5 by applying a signal current Is which is generated on the side of the driver 1 to a loop which is constituted by the balanced transmission lines of the upward transmission line 3 and the downward transmission line 4 and the terminating resistor 5 on the side of the receiver 2. The signal "1" or "0" is identified by switching the direction of the flow of the signal current Is. According to this structure, since the signal currents Is flowing on the upward transmission line 3 and the downward transmission line 4 have the same size but flow in the opposite directions, the magnetic fields generated by the entire balanced transmission lines are cancelled by each other. Owing to this characteristic, the noise produced by a change in the current of the transmission system is small, and the interference between the transmission lines of the adjacent ports and the interference of simultaneous switching between LSIs are small. Accordingly, the LVDS interface is suitable for high-speed signal transmission.

FIG. 13 shows an example of a conventional LVDS driver circuit.

In FIG. 13, the symbols N100 and N101 denote a pair of NMOS transistors as current switching elements on the high-potential side, N102 and N103 a pair of NMOS transistors as current switching elements on the low-potential side. The source of the NMOS transistor N100 is connected in series to the drain of the NMOS transistor N102, while the source of the NMOS transistor N101 is connected in series to the drain of the NMOS transistor N103. Both the drains of the NMOS transistors N100 and N101 are connected to the current source I100, and both the sources of the NMOS transistors N102 and N103 are connected to an NMOS transistor N104 as a load element.

The symbol B100 represents a control signal generator provided with inverters X100, X101, which are CMOS logic circuits. The control signal generator B100 generates (1) a positive phase control signal S for driving one NMOS transistor N100 on the high-potential side and one NMOS transistor N103 on the low-potential side, and (2) a negative phase control signal *S for driving the other NMOS transistor N101 on the high-potential side and the other NMOS transistor N102 on the low-potential side. To state this concretely, the control signal generator B100 inputs an input signal of CMOS level to the inverters X100, X101, and inputs the positive phase control signal S which is output from the inverter X101 to the gate terminals of the NMOS transistors N100, N103, while inputting the negative phase control signal *S which is output from the inverter X100 to the gate terminals of the NMOS transistors N101, N102.

If the input signal is H, the negative phase control signal *S is L and the positive phase control signal S is H. As a result, the NMOS transistors N100, N103 are turned on, while the NMOS transistors N101, N102 are turned off. The current flows from the NMOS transistor N100 toward the NMOS transistor N103 via the transmission line 3, the terminating resistor 5 and the transmission line 4, as indicated by the dotted line, and the LVDS output signal becomes H. On the other hand, if the input signal is L, the negative phase control signal *S is H and the positive phase control signal S is L. As a result, the NMOS transistors N101, N102 are turned on, while the NMOS transistors N100, N103 are turned off. The current therefore flows from the NMOS transistor N101 toward the NMOS transistor N102 via the transmission line 4, the terminating resistor 5 and the transmission line 3, as indicated by the alternate short and long dash line, and the LVDS output signal becomes L. The dc potential is supplied by the voltage which is generated by the NMOS transistor N104 as a load element.

In the conventional structure, there is a phase difference corresponding to one inverter being between the positive phase control signal S and the negative phase control signal *S. Therefore, a time difference is produced between the switching operation of the NMOS transistors N100, N103 which are turned on when the LVDS output is H and the switching operation of the NMOS transistors N101, N102 which are turned on when the LVDS output is L, so that the leading edge and the trailing edge of the LVDS output signal H are asymmetric and the output waveform therefore disadvantageously has a pulse width distortion.

FIG. 14 schematically shows a waveform response which explains such a problem in the related art. There is a phase difference θ between the positive phase control signal S and the negative phase control signal *S. For this reason, the timing at which a first current path from the NMOS transistor N100 to the NMOS transistor N103 is turned off does not agree to the timing at which a second current path from the NMOS transistor N101 to the NMOS transistor N102 is turned on. That is, the timing for OFF delays by θ corresponding to the phase difference. As a result, there is a period during which both the first and second paths are on. During this period, the LVDS output is not constant, so that the pulse width of the LVDS output is not constant. If the bit rate of an input signal is low, such a pulse width distortion generates little problem, but if the bit rate becomes high, the an exact transmission of a signal becomes remarkable impossible.

In addition, while the NMOS transistor pair N100, N101 on the high-potential side operate in the saturated region, the NMOS transistor N102, N103 pair on the low-potential side operate in the unsaturated region. In the unsaturated region, the switching characteristic is inferior to that in the saturated state, which also leads to a deterioration of the output waveform.

In the normal operation, such a degree of waveform deterioration generates little problem. However, when the noise margin is small, for example, when the LVDS output is used as an output of a optical receiver circuit for amplifying a minute signal level, it is necessary to strictly regulate the pulse distortion of the output waveform.

SUMMARY OF THE INVENTION

Accordingly, it is an object of the present invention to eliminate the above-described problems in the related art and to provide a driver circuit which is capable of making the switching characteristics at the on/off time of the MOS transistor pair constituting a first current path and the MOS transistor pair constituting a second current path symmetric.

It is another object of the present invention to provide a driver circuit which is capable of using the MOS transistors for switching in the saturated region and improving the switching characteristics.

It is still another object of the present invention to provide a driver circuit which is capable of eliminating a pulse width distortion and which is suitable for transmitting a small-amplitude signal at a high speed.

To achieve these objects, in a driver circuit provided in a first aspect of the present invention, (1) the drains of field effect transistors having the opposite polarities are connected to each other so as to constitute second switching means as well as first switching means, (2) one of differential driving signals is input to the gate terminal of each of the field effect transistors constituting a first switching means, while the drain terminals are connected to one of the transmission line pair, (3) the other of differential driving signals is input to the gate terminal of each of the field effect transistors constituting a second switching means, while the drain terminals are connected to the other of the transmission line pair.

In a second aspect of the present invention, there is provided a driver circuit comprising (1) a pair of PMOS transistors as current switching elements on the high-potential side, (2) a pair of NMOS transistors as current switching elements on the low-potential side; and (3) a control signal generator which generates a positive phase control signal for driving a first PMOS transistor of the PMOS transistor pair and a first NMOS transistor of the NMOS transistor pair and inputs the positive phase control signal to the gates of the corresponding transistors, and which generates a negative phase control signal for driving a second PMOS transistor of the PMOS transistor pair and a second NMOS transistor of the NMOS transistor pair and inputs the negative phase control signal to the gates of the corresponding transistors, (4) wherein the drain of the first PMOS transistor is connected to the drain of the first NMOS transistor, and one of the transmission lines is connected to the portion at which the drains of the first PMOS transistor and the first NMOS transistor are connected and, (5) the drain of the second PMOS transistor is connected to the drain of the second NMOS transistor, and the other of the transmission lines is connected to the portion at which the drains of the second PMOS transistor and the second NMOS transistor are connected.

According to this driver circuit, when an input signal is at a high level H, a PMOS transistor driven by a negative phase control signal (L) and a NMOS transistor driven by a positive phase control signal (H) constitute a first current path via the first transmission line and the second transmission line. On the other hand, when an input signal is at a low level L, a PMOS transistor driven by a positive phase control signal (L) and a NMOS transistor driven by a negative phase control signal (H) constitute a second current path via the second transmission line and the first transmission line. In other words, the first current path drives a current when the positive phase control signal is H and the negative phase control signal is L, while the second current path drives a current when the positive phase control signal is L and the negative phase control signal is H. As a result, the leading edge and the trailing edge of an LVDS output signal is symmetric, so that it is possible to reduce a pulse width distortion and to cope with high-speed signal transmission.

A control signal circuit is constituted by not less than two CMOS logic circuits (inverters). A delay circuit is connected to at least one of the CMOS logic circuit for generating a negative phase control signal and the CMOS logic circuit for generating a positive phase control signal, and the phase difference between the positive phase control signal and the negative phase control signal is reduced to, for example, zero. In this manner, it is possible to prevent the first current path and the second current path from turning on simultaneously. That is, it is possible to turn off the second current path the moment when the first current path is turned on, and to turn off the first current path the moment when the second current path is turned on. In other words, it is possible to make the switching characteristics at the on/off time of the MOS transistor pair constituting the first current path and the MOS transistor pair constituting the second current path symmetric, thereby improving the LVDS output waveform.

A first current source is inserted between the source terminals of the PMOS transistor pair on the high-potential side and the high-potential wire, while a second current source is inserted between the source terminals of the NMOS transistor pair on the low-potential side and the low-potential wire, and each drain of the NMOS transistor on the low-potential side and the constant-voltage source is connected by a bias resistor element. In this manner, it is possible to use the NMOS transistor on the low-potential side in the saturated region, thereby improving the switching characteristics and reducing the pulse width distortion of the LVDS output.

In this driver circuit, the control signal generator may be constituted by a differential amplifier to which analog differential signals are input and which outputs a positive phase control signal and a negative phase control signal. In this manner, it is possible to provide a driver circuit of an LVDS interface even when analog differential signals are input.

Other features and advantages of the present invention will be apparent from the following description taken in conjunction with the accompanying drawings.

BRIEF DESCRIPTION OF THE DRAWINGS

FIG. 2 shows signal waveforms in a driver circuit according to the present invention;

FIG. 4 shows a third embodiment of the present invention;

DESCRIPTION OF THE PREFERRED EMBODIMENTS (A) First Embodiment

Figure 1:
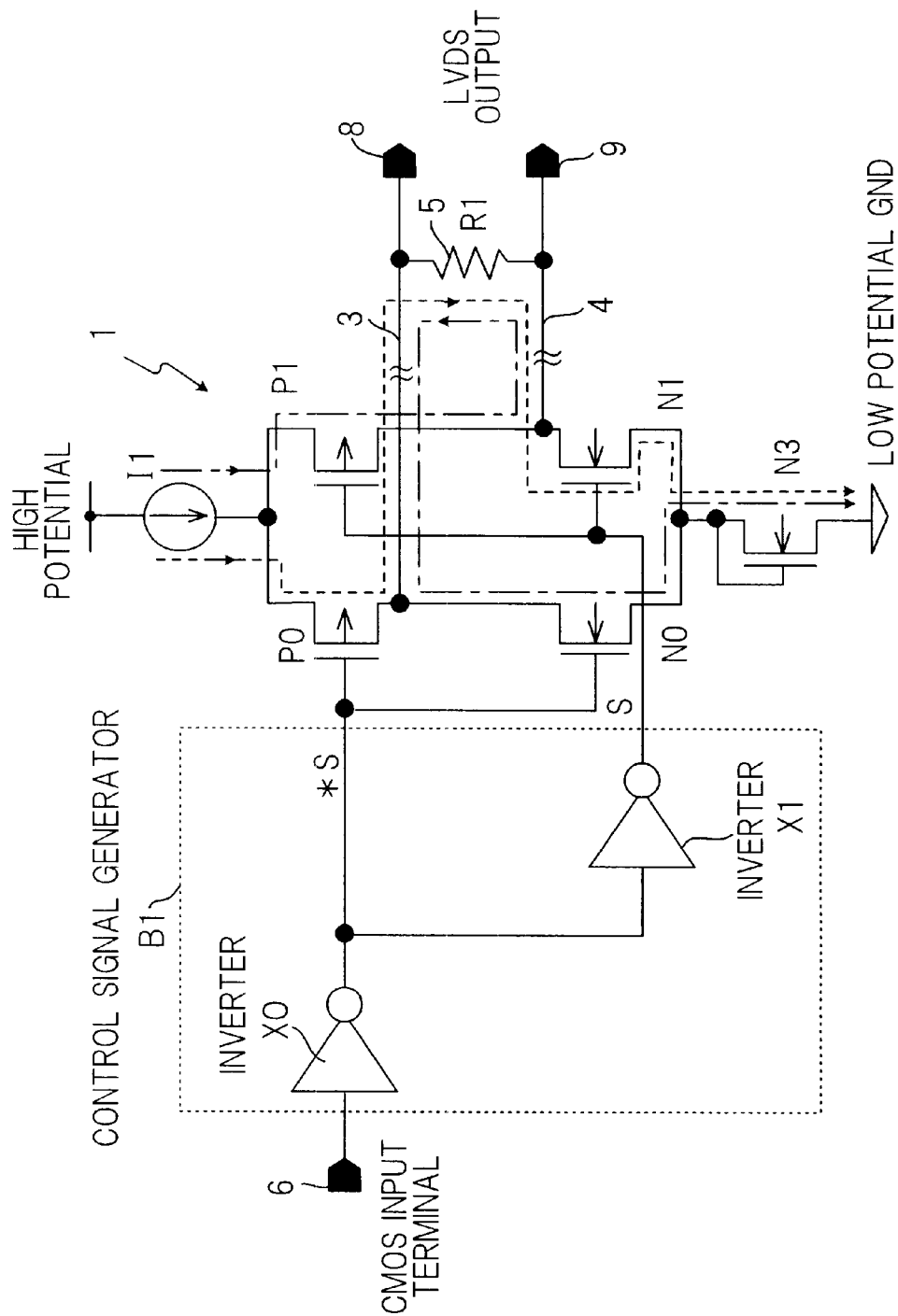
FIG. 1 shows a first embodiment of the present invention.
Figure 12:
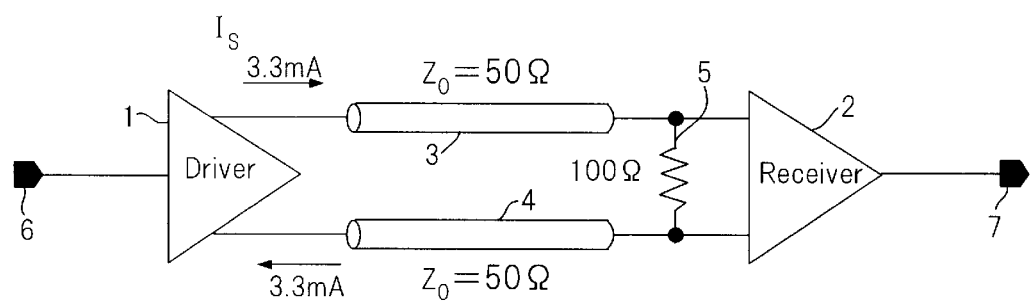
FIG. 12 shows an example of the structure of an LVDS interface.

FIG. 1 shows the structure of a first embodiment of a driver circuit according to the present invention. The same reference numerals are provided for the elements which are the same as those shown in FIG. 12. In FIG. 1, the reference numeral 1 represents a driver circuit for an LVDS interface, 3 a first transmission line, 4 a second transmission line, 5 a terminating resistor, 6 a CMOS input terminal and 8, 9 the input terminals of an LVDS receiver (not shown).

In the driver circuit 1, the symbols P0 and P1 represent a pair of PMOS transistors as current switching elements on the high-potential side, and N0 and N1 represent a pair of NMOS transistors as current switching elements on the low-potential side. The drain of the PMOS transistor P0 is connected in series to the drain of the NMOS transistor N0 and the drain of the PMOS transistor P1 is connected in series to the drain of the NMOS transistor N1. Both the sources of the PMOS transistors P0, P1 are connected to a current source I1, and both the sources of the NMOS transistors N0, N1 are connected to a NMOS transistor N3 as a load element.

The symbol B1 represents a control signal generator, which is provided with inverters X0, X1 connected in series as CMOS logic circuits. The control signal generator B1 generates (1) a positive phase control signal S for driving one PMOS transistor P1 on the high-potential side and one NMOS transistor N1 on the low-potential side, and (2) a negative phase control signal *S for driving the other PMOS transistor P0 on the high-potential side and the other NMOS transistor N0 on the low-potential side. To state this concretely, the control signal generator B1 inputs a input signal of CMOS level to the inverters X0, X1, and inputs the positive phase control signal S which is output from the inverter X1 to the gate terminals of the PMOS transistor P1 and the NMOS transistor N1, while inputting the negative phase control signal *S which is output from the inverter X0 to the gate terminals of the PMOS transistor P0 and the NMOS transistor N0.

If the input signal is at a high level H, the negative phase control signal *S is at a low level L and the positive phase control signal S is at a high level H. As a result, the PMOS transistor P0 and the NMOS transistor N1 are turned on, while the PMOS transistor P1 and the NMOS transistor N0 are turned off. The current therefore flows on the first current path indicated by the dotted line. That is, the current flows from the PMOS transistor P0 toward the NMOS transistor N3 via the transmission line 3, the terminating resistor 5, the transmission line 4 and the NMOS transistor N1, and the LVDS output signal becomes H. On the other hand, if the input signal is L, the negative phase control signal *S is H and the positive phase control signal S is L. As a result, the PMOS transistor P1 and the NMOS transistor N0 are turned on, while the PMOS transistor P0 and the NMOS transistor N1 are turned off. The current therefore flows on the second current path indicated by the alternate short and long dash line. That is, the current flows from the PMOS transistor P1 toward the NMOS transistor N3 via the transmission line 4, the terminating resistor 5, the transmission line 3 and the NMOS transistor N0, and the LVDS output signal becomes L. The dc potential is supplied by the voltage which is generated by the load element N3.

Figure 13:
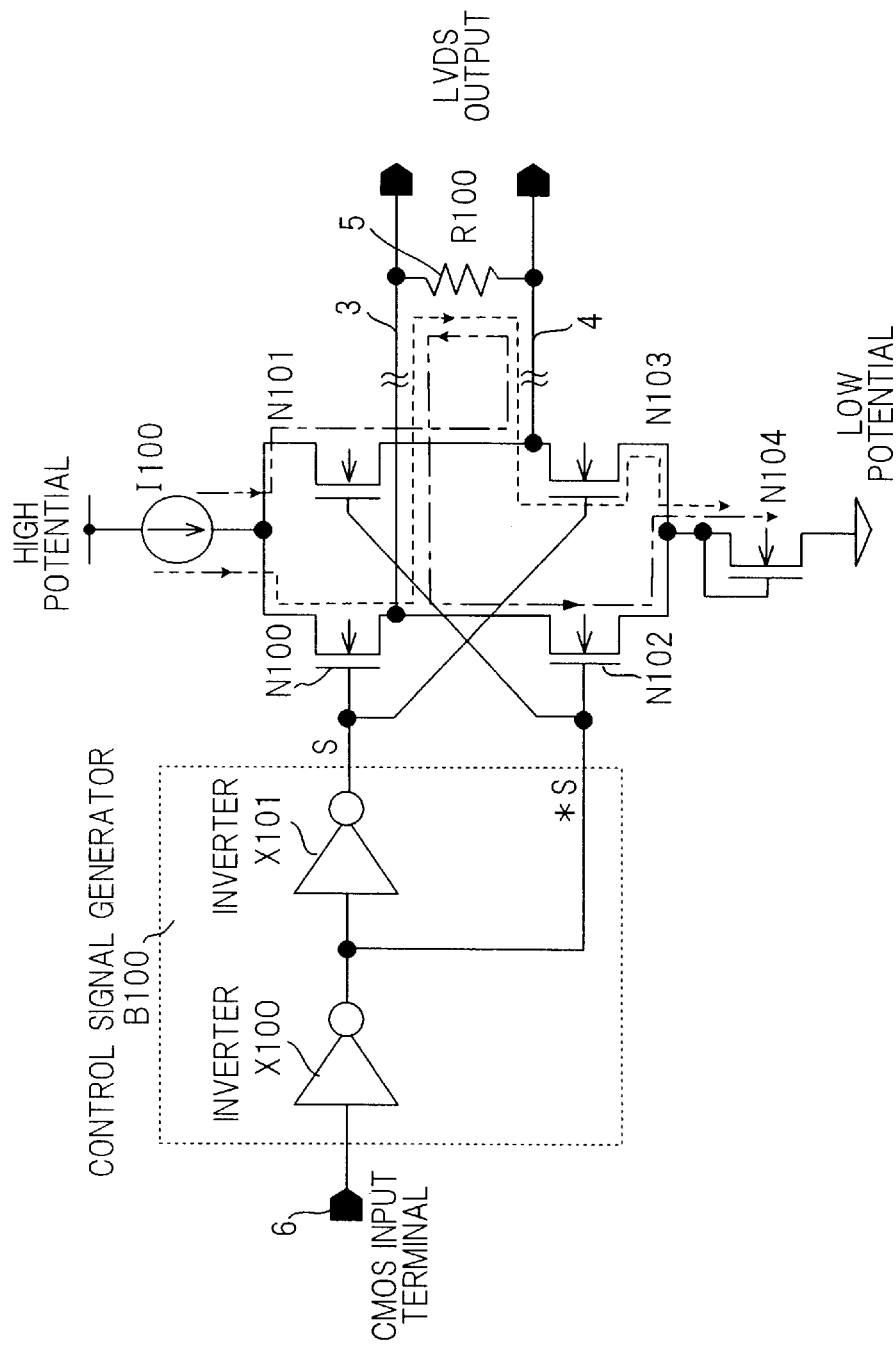
FIG. 13 shows a conventional driver circuit.
Figure 14:
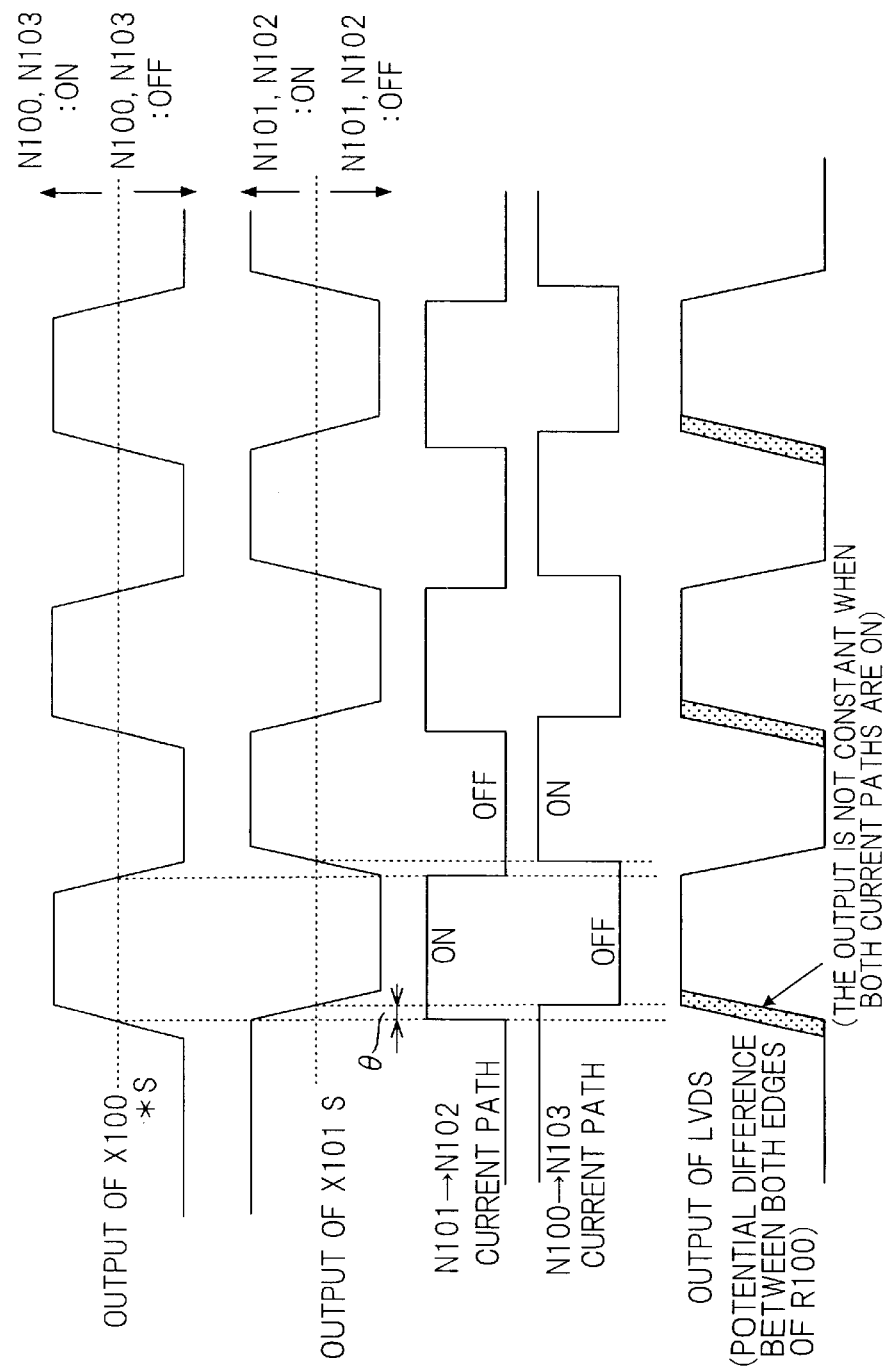
FIG. 14 shows signal waveforms in a conventional driver circuit.

According to such a driver circuit, the first current path drives a current when the positive phase control signal S is H and the negative phase control signal *S is L, while the second current path drives a current when the positive phase control signal S is L and the negative phase control signal *S is H, as shown in FIG. 2. As a result, since the switching elements on the high-potential side are constituted by the PMOS transistors P0 and P1 in the first embodiment, the switching logic is reverse to that of a conventional driving circuit (FIG. 13), and the LVDS output waveform is approximately symmetric at L/H (Low/High). The driver circuit is thus capable of high-speed signal transmission. Even though there is a period during which the first current path and the second current path are simultaneously off, there is no possibility of simultaneously turning on the first and second current paths, so that the LVDS output is constant, thereby reducing the pulse width distortion.

(B) Second Embodiment

Figure 3A:
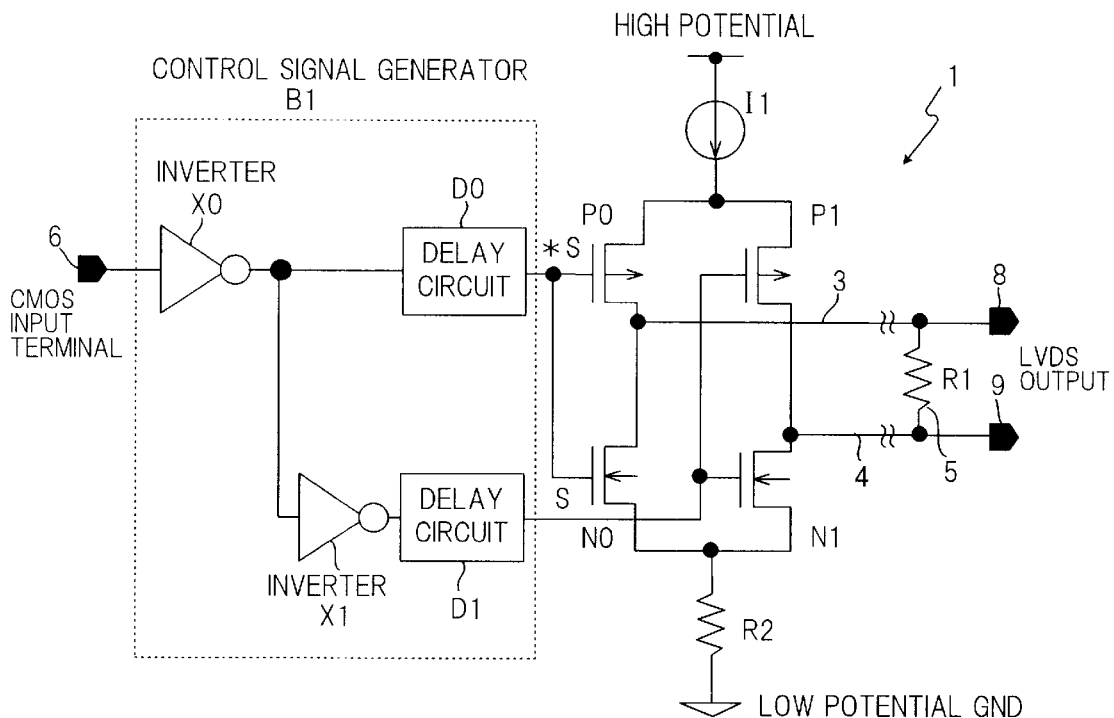
FIGS. 3A and 3B show a second embodiment of the present invention.

FIG. 3A shows the structure of a second embodiment of a driver circuit according to the present invention. The same reference numerals are provided for the elements which are the same as those in the first embodiment shown in FIG. 1. The second embodiment is different from the first embodiment in the structure of the control signal generator B1 and the load element on the low-potential side for supplying a dc level. As the load element in the second embodiment, a resistor R2 is used in place of the NMOS transistor.

In the control signal generator B1 in the second embodiment, the inverters X0, X1 are connected in series. A delay circuit D0 is connected to the output terminal of the inverter X0 at a first stage, and a delay circuit D1 is connected to the output terminal of the inverter X1 at a second stage. Each of the delay circuit D0, D1 delays the output of the inverter X0 (X1) by a predetermined time so that the phase difference between the positive phase control signal S and the negative phase control signal *S may become zero. In the first embodiment, a phase difference corresponding to the delay of the inverter X1 is produced between the positive phase control signal S and the negative phase control signal *S. In contrast, according to the second embodiment, since the delay circuits D0, D1 having different delays are inserted, the phases of the positive phase control signal S and the negative phase control signal *S are adjusted, thereby reducing the phase difference (ideally, to zero).

According to the second embodiment, it is possible to eliminate the possibility of simultaneously turning off the first and second current paths. The moment the first current path is on, the second current path is turned off, while the moment the second current path is turned on, the first current path is turned off. In other words, it is possible to make the switching characteristics at the on/off time of the MOS transistor pair constituting the first current path and the MOS transistor pair constituting the second current path symmetric, thereby further improving the LVDS output waveform.

Although two delay circuits are provided in the second embodiment shown in FIG. 3A, it is possible to provide only one delay circuit D0 on the negative phase control signal side on which the phase leads. The delay circuits D0, D1 are constituted by, for example, inverters which have different driving capacities.

Figure 3B:
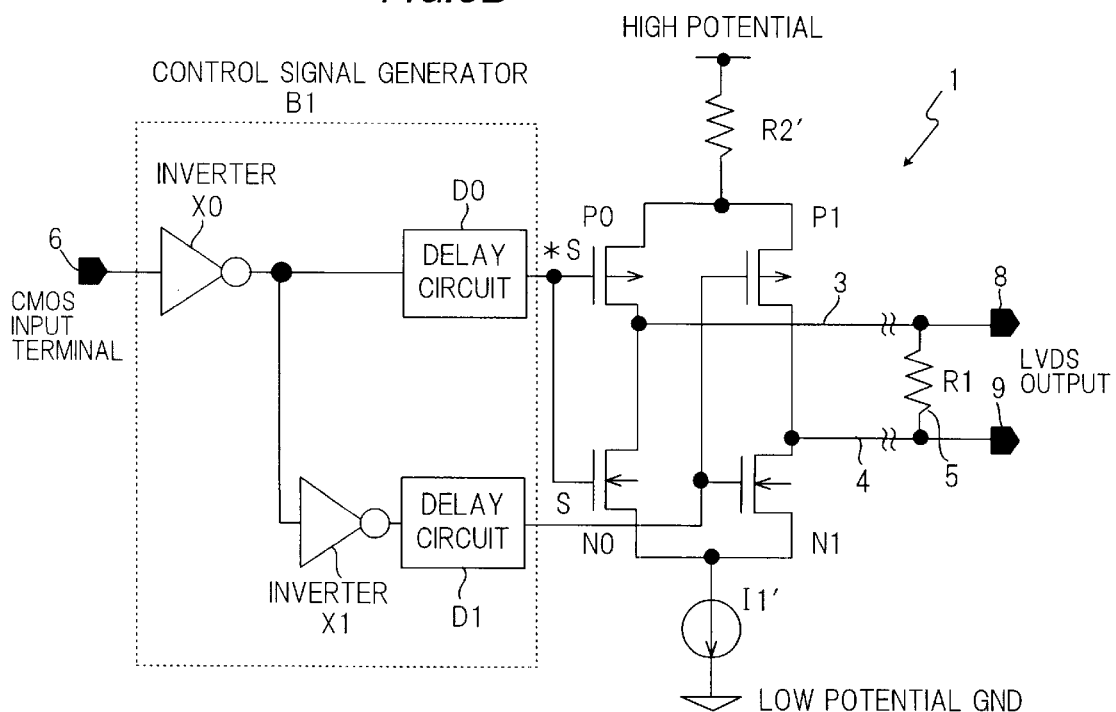

In the first and second embodiments, the current source is connected to the sources of the PMOS transistor pair P0, P1 on the high-potential side, and a load element is connected to the NMOS transistor pair N0, N1 on the low-potential side. This structure may be reversed, and it is possible to connect a load element R2' to the PMOS transistor pair P0, P1 and a current source I1' to the NMOS transistor pair N0, N1, as shown in FIG. 3B.

(C) Third Embodiment

FIG. 4 shows the structure of a third embodiment of a driver circuit according to the present invention. The same reference numerals are provided for the elements which are the same as those in the first embodiment shown in FIG. 1. The third embodiment is different from the first embodiment in (1) that a current source I2 is connected to the sources of the NMOS transistor pair N0, N1 of the low-potential side in place of the NMOS transistor as a load element, (2) that a bias resistor element constituted by a NMOS transistor N4 is inserted between the portion at which the drain of the PMOS transistor P0 and the drain of the NMOS transistor N0 are connected and the constant voltage source V1, and (3) that a bias resistor element constituted by a NMOS transistor N5 is inserted between the portion at which the drain of the PMOS transistor P1 and the drain of the NMOS transistor N1 are connected and the constant voltage source V1.

The current source I2 is connected to the sources of the NMOS transistors N0, N1 so as to approximately equalize the current capacities of the current sources I1 and I2. According to this structure, it is possible to operate the NMOS transistor pair N0, N1 as the switching elements on the low-potential side in the saturated region, thereby further improving the switching characteristics. Since the current source I2 cannot supply a dc level unlike a load element, it is preferable to supply a dc level by another element. In the third embodiment, the voltage source V1 and the NMOS transistors N4, N5 which serve as a bias resistor supply a dc potential to the drains of the respective MOS transistor pairs P0, P1 and N0, N1 so that the NMOS transistor pair N0, N1 may operate in the saturated region. Each of the bias resistors N4, N5 may be constituted by a resistor element or a PMOS transistor. It is also possible to constitute each bias resistor by the combination of a NMOS transistor and a PMOS transistor.

Figure 5:
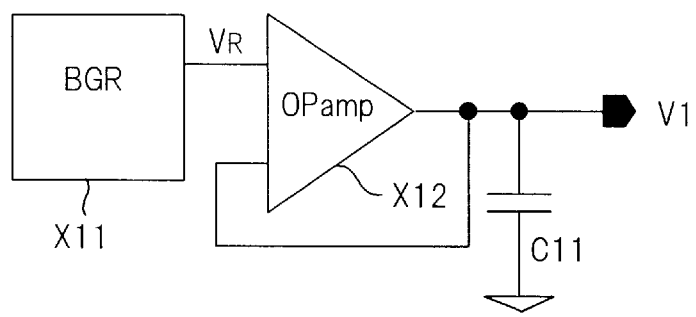
FIG. 5 shows the circuitry structure of a voltage source.

FIG. 5 shows an example of the circuitry structure of the voltage source V1 in the third embodiment. In FIG. 5, the reference numeral symbol X11 represents a reference voltage generator for generating a reference voltage, for example, a known band gap reference voltage source (BGR circuit) for stably supplying a reference voltage $V_R$ of about 1.2 V without being influenced by a temperature change, X12 an operational amplifier which serves as a buffer for equalizing the output voltage and the reference voltage $V_R$, and C11 a capacitance for absorbing a high-frequency current.

In the voltage source shown in FIG. 5, the reference voltage $V_R$ is 1.2 V. If this is not the case, it is possible to insert a noninverting amplifier or a divider circuit so as to adjust the output voltage to about 1.2 V. It is also possible to supply the reference voltage $V_R$ by using a zener diode or the like in place of the BGR circuit.

Figure 6:
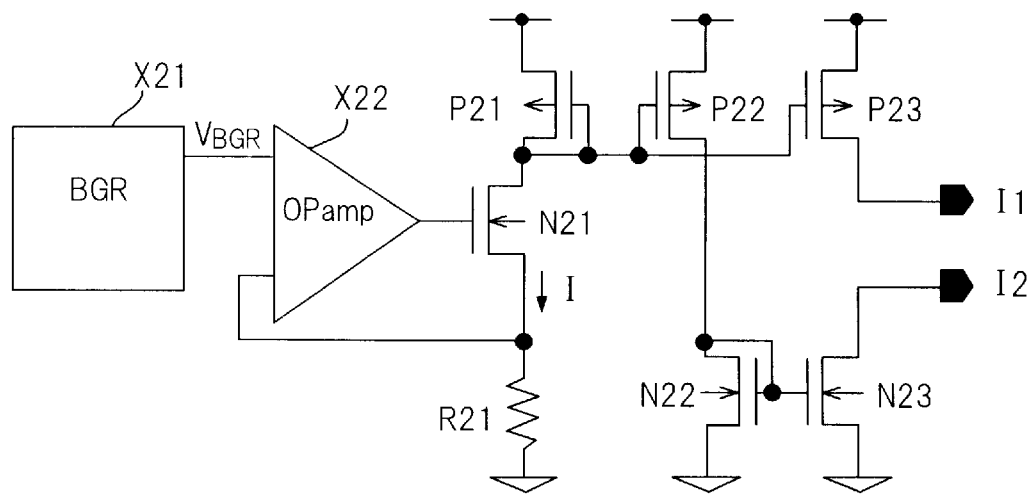
FIG. 6 shows the circuitry structure of current sources.

FIG. 6 shows the circuitry structure of the current sources I1, I2 in the third embodiment.

In FIG. 6, the symbol X21 denotes a BGR circuit for stably supplying a reference voltage $V_{BGR}$, X22 an operational amplifier, and R21 a resistor. The resistor R21, the BGR circuit X21 and the operational amplifier X22 constitute a negative feed back circuit for operating so as to equalize the source voltage of a NMOS transistor N21 and the reference voltage $V_{BGR}$. Therefore, the current I flowing to the resistor R21 is represented by $V_{BGR}/R_{21}$.

Each pair of (1) the PMOS transistors P21 and P23, (2) the PMOS transistors P21 and P22, and (3) the NMOS transistors N22 and N23 constitute a current mirror.

Therefore, when a constant current I flows to the resistor R21, the current I flows to the PMOS transistor P23 due to the current mirror and a constant current I1 is output. In addition, owing to the current mirror, the current I also flows to the PMOS transistor P22 via the NMOS transistor N22, and owing to another current mirror, the current I flows to the NMOS transistor N23, so that a constant current I2 is output. Actually, I1 and I2 are approximately equally about 3 mA. According to this structure, it is possible to provide a highly accurate circuit for the currents sources I1, I2.

There is any special restriction to the voltage input to the operational amplifier X22. It is therefore possible to insert a noninverting amplifier or a divider circuit so as to convert the reference voltage to an appropriate voltage. It is also possible to supply the reference voltage $V_{BGR}$ by using a zener diode or the like in place of the BGR circuit. In addition, if a cascode connection current mirror is used as a current mirror, the accuracy can be further improved.

(D) Fourth Embodiment

The LVDS driver circuit in the first embodiment (FIG. 1) has a structure in which a differential pair of PMOS transistors P0, P1 are opposed to a differential pair of NMOS transistors N0, N1, so that this circuit has a good matching with an analog differential circuit. It is therefore possible to drive the PMOS transistor pair P0, P1 and the NMOS transistor pair N0, N1 by a differential amplifier.

Figure 7:
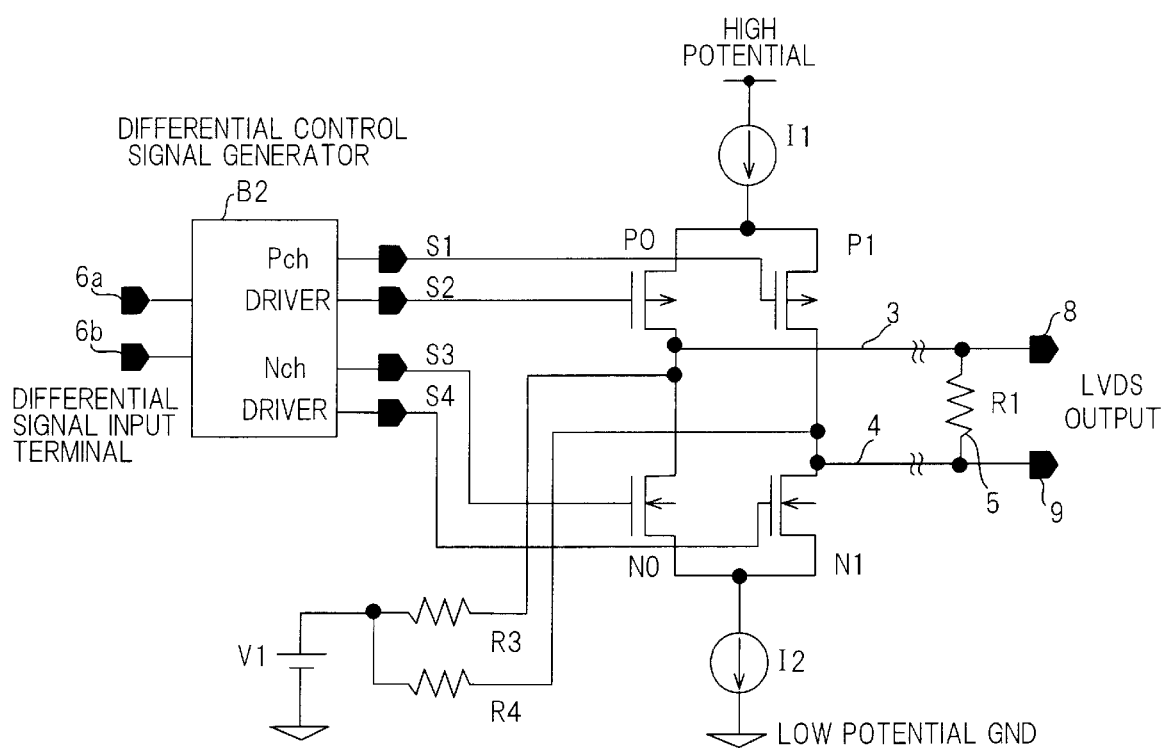
FIG. 7 shows a fourth embodiment of the present invention.

FIG. 7 shows the structure of a fourth embodiment of the present invention. In this embodiment, the switching elements are driven by a differential amplifier. In FIG. 7, the same reference numerals are provided for the elements which are the same as those in the third embodiment. The fourth embodiment is different from the third embodiment in that the control signal generator is constituted by an analog differential amplifier in place of the CMOS logic circuits.

Analog differential signals as input signals are input to a differential control signal generator B2 from the input terminals 6a and 6b, and the differential control signal generator B2 generates signals S1, S2 for driving the differential pair of PMOS transistors P0, P1, and signals S3, S4 for driving the differential pair of NMOS transistors N0, N1. The signals S1, S2 have approximately the same dc level, and the signals S3, S4 have approximately the same dc level. The signals S1, S4 have the same polarity, while the signals S2, S3 have the same polarity. It is preferable that the phases of the signals S1, S4 and the phases of the signals S2, S3 are approximately the same, respectively.

(a) First Example of the Structure of the Differential Control Signal Generator

Figure 8:
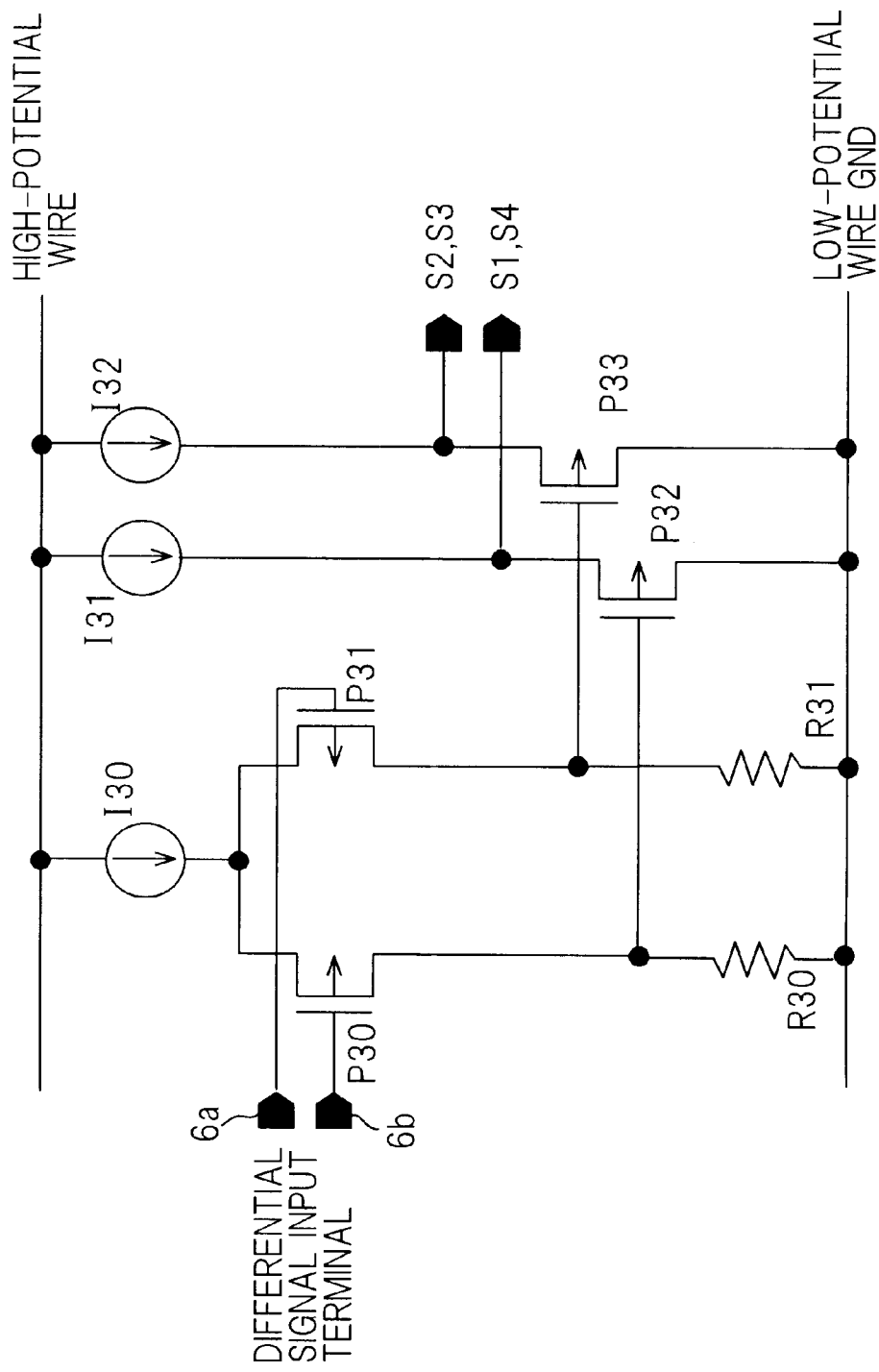
FIG. 8 shows a first example of the structure of a differential control signal generator.

FIG. 8 shows a first example of the structure of the differential control signal generator B2. In this structure, the signals S2, S3 are used in common, and the signals S1, S4 are used in common. In FIG. 8, the symbols I30 to I32 denote constant current sources, P30, P31 a PMOS transistor differential pair, R30, R31 load resistors inserted between the drain terminals of the PMOS transistor differential pair P30, P31 and low potential wire GND, and P32, P33 PMOS transistors constituting a source follower circuit. In the PMOS transistors P32, P33, the terminal voltage of the resistors R30, R31 are input to the gates, the current sources I31, I32 are connected to the sources, and the drains are connected to the low-potential wire. The signals S1, S4 are output from the source of the PMOS transistor P32, and the signals S2, S3 are output from the source of the PMOS transistor P33. The PMOS transistors P32, P33 and the current sources I31, I32 constitute the source follower circuit.

When a differential signal of a high level H is input to the differential signal input terminal 6a and a differential signal of a low level L is input to the differential signal input terminal 6b, the PMOS transistor P30 is turned on and the PMOS transistor P31 is turned off. A signal of H is input to the gate of the PMOS transistor P32, and a signal of L is input to the gate of the PMOS transistor P33. As a result, the signals S1, S4 of a high level H are output. The signals S2, S3 of a low level L are output. Owing to the H of the signals S1, 54 and the L of the signals S2, S3, the PMOS transistor P0 and the NMOS transistor N1 shown in FIG. 7 are turned on, thereby forming a first current path and outputting an LVDS output of H.

On the other hand, when a differential signal of a low level L is input to the differential signal input terminal 6a and a differential signal of a high level H is input to the differential signal input terminal 6b, the PMOS transistor P30 is turned off and the PMOS transistor P31 is turned on. A signal of L is input to the gate of the PMOS transistor P32, and a signal of H is input to the gate of the PMOS transistor P33. As a result, the signals S1, S4 of a low level L are output. The signals S2, S3 of a high level H are output. Owing to the L of the signals S1, S4 and the H of the signals S2, S3, the PMOS transistor P1 and the NMOS transistor N0 shown in FIG. 7 are turned on, thereby forming a second current path and outputting an LVDS output of L.

The dc level of the LVDS output signal is determined based upon the GND level. For this reason, it is preferable, as the differential amplifier to use the PMOS transistors P30, P31 the output levels of which are determined based upon the GND level. A similar effect is produced by using PNP transistors as the differential amplifier. On the other hand when NMOS transistors or NPN transistors are used as the differential amplifier, since the output level is determined based upon the power source level, the design of a dc voltage is comparatively difficult, but higher-speed response can be expected.

(b) Second Example of the Structure of the Differential Control Signal Generator In the circuit shown in FIG. 8, since the signals S2, S3 are used in common, and the signals S1, S4 are used in common, the dc levels of the signals S1, S2 become too high to drive the PMOS transistor differential pair P0, P1 (FIG. 7) and it is disadvantageously impossible to lower the supply voltage supplied from the high potential wire.

Figure 9:
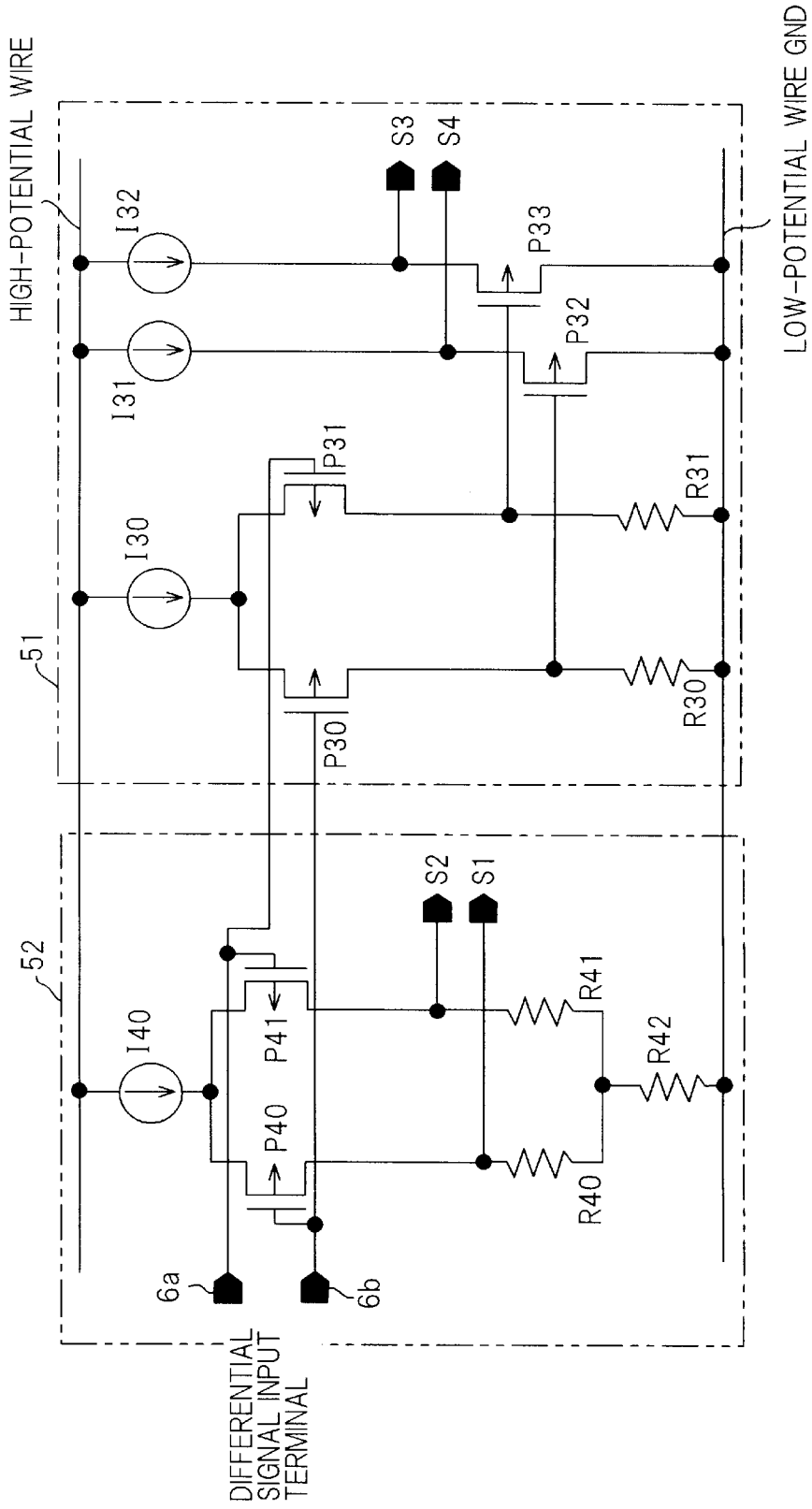
FIG. 9 shows a second example of the structure of a differential control signal generator.

FIG. 9 shows a second example of the structure of the differential control signal generator B2. In this structure, the signals S1 to S4 are generated separately from each other so that the dc levels of the signals S1 and S2 may become lower than those of the signals S3 and S4. In the differential control signal generator shown in FIG. 9, another differential control signal generator 52 is provided at a preceding stage to a differential control signal generator 51 having the same structure as that shown in FIG. 8.

In the differential control signal generator 52, the symbols I40 represents a constant current source, P40, P41 a PMOS transistor differential pair, R40, R41 resistors connected to the drain terminals of the PMOS transistor differential pair P40, P41, and R42 a resistor inserted between the resistors R40, R41 and the grounded wire (GND).

The first differential signal input terminal 6a is connected to the gate terminals of a PMOS transistor P31 of the differential PMOS transistor pair in the differential control signal generator 51 and a PMOS transistor P41 of the differential PMOS transistor pair in the differential control signal generator 52, and the second differential signal input terminal 6b is connected to the gate terminals of a PMOS transistor P30 of the differential PMOS transistor pair in the differential control signal generator 51 and a PMOS transistor P40 of the differential PMOS transistor pair in the differential control signal generator 52. The signals S1, S2 are output from the connecting portions of the drains of the PMOS transistors P40, P41 constituting the differential pair in the differential control signal generator 52 and the resistors R40, R41, respectively, the signal S4 is output from the source of the PMOS transistor P32 constituting the source follower circuit of the differential control signal generator 51, and the signal S3 is output from the source of the PMOS transistor P33.

According to this structure, it is possible to supply a dc bias for the signals S1, S2 which drive the PMOS transistor differential pair P1, P0 (FIG. 7) by lowering the voltages of the load resistors R40, R42. It is therefore possible to make the dc levels of the driving signals S1, S2 for the PMOS transistor pair P0, P1 lower than the dc levels of the driving signals S3, S4 for the NMOS transistor pair N0, N1, thereby lowering the supply voltage supplied from the high potential wire.

(c) Third Example of the Structure of the Differential Control Signal Generator

Figure 10:
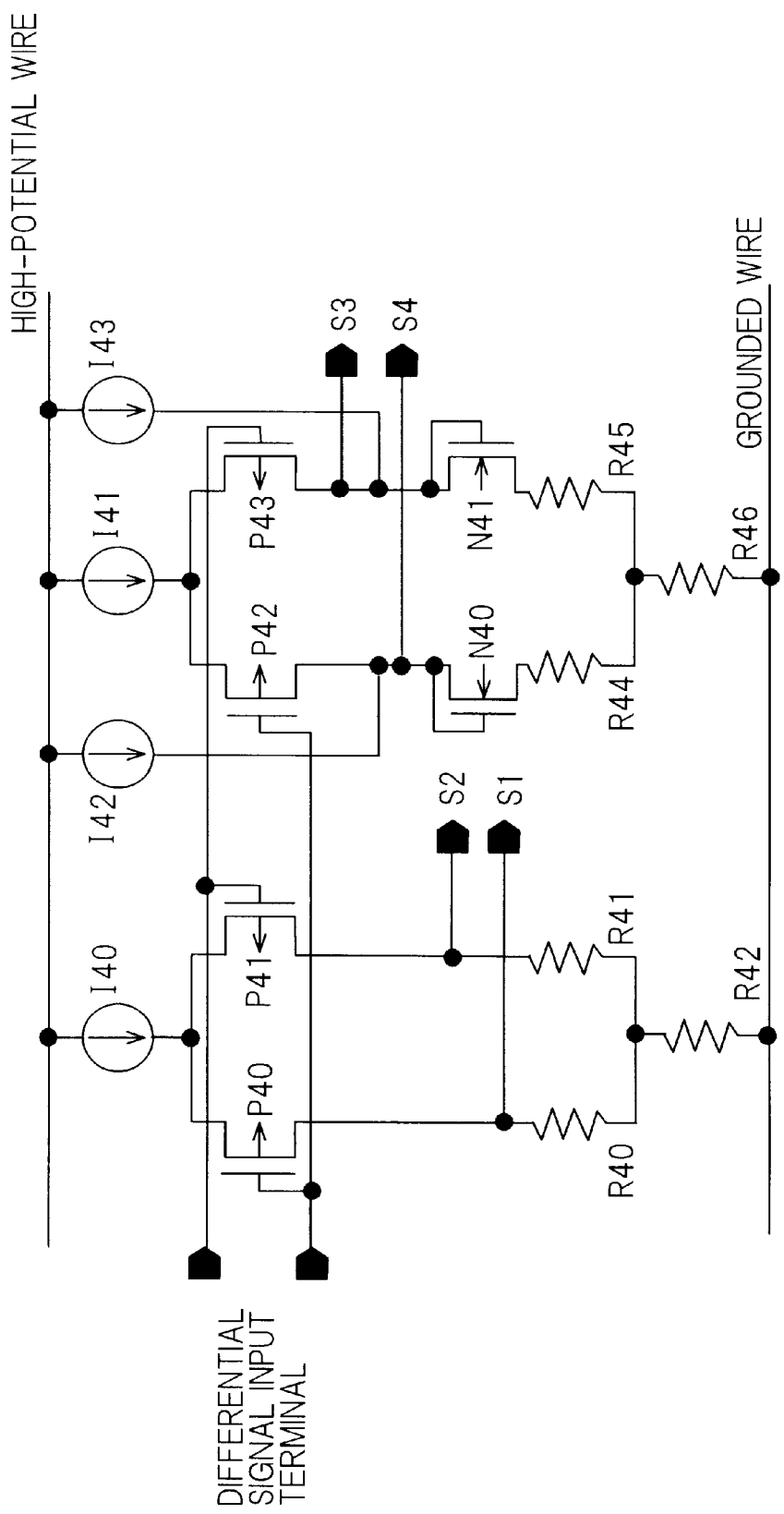
FIG. 10 shows a third example of the structure of a differential control signal generator.

FIG. 10 shows a third example of the structure of the differential control signal generator. In this structure, the signals S1 to S4 are generated separately from each other so that the dc levels of the signals S1 and S2 may become lower than those of the signals S3 and S4, in the same way as the second example shown in FIG. 9.

In FIG. 10, the symbol I40 represents a constant current source, P40, P41 a first PMOS transistor differential pair, R40, R41 resistors connected to the drain terminals of the first PMOS transistor differential pair P40, P41, and R42 a resistor inserted between the resistors R40, R41 and the grounded wire (GND).

The symbol I41 represents a constant current source, and the symbols P42, P43 a second PMOS transistor differential pair, and N40, N41 NMOS transistors which function as load resistor elements and which are connected to the drain terminals of the second differential pair P42, P43. The symbols I42, I43 represent constant current sources for constantly turning on the NMOS transistors N40, N41 as load resistor elements, R44, R45 resistors connected in series to the load resistor elements N40, N41, and R46 a resistor inserted between the resistors R44, R45 and the grounded wire (GND).

The first differential signal input terminal 6a is connected to the gate terminals of a PMOS transistor P41 of the first differential PMOS transistor pair and a PMOS transistor P43 of the second differential PMOS transistor pair, and the second differential signal input terminal 6b is connected to the gate terminals of a PMOS transistor P40 of the first differential PMOS transistor pair and a PMOS transistor P42 of the differential PMOS transistor pair. The signals S1, S2 are output from the connecting portions of the drains of the PMOS transistors P40, P41 constituting the first differential pair and the resistors R40, R41, respectively, and the signals S3, S4 are output from the connecting portions of the drains of the PMOS transistors P42, P43 constituting the second differential pair and the load resistor elements N40, N41, respectively.

The dc bias for the signals S1, S2 which drive the PMOS transistor differential pair P1, P0 (FIG. 7) is supplied by the load resistors R40 to R42, and the dc bias for the signals S3, S4 which drive the NMOS transistor differential pair N0, N1 (FIG. 7) is supplied by the load resistors R44 to R46 and the load resistor elements (NMOS transistors) N40, N41. As a result, the dc levels of the signals S1, S2 for driving the PMOS transistors P0, P1 become lower than the dc levels of the signals S3, S4 for driving the NMOS transistors N0, N1, and it is possible to lower the supply voltage supplied from the high potential wire. In addition, since the gate-source voltage $V_{GS}$ of the NMOS transistors N40, N41 and the gate-source voltage $V_{GS}$ of the NMOS transistors N0, N1 of the LVDS driver circuit are cancelled by each other, it is possible to supply a good bias.

Figure 11:
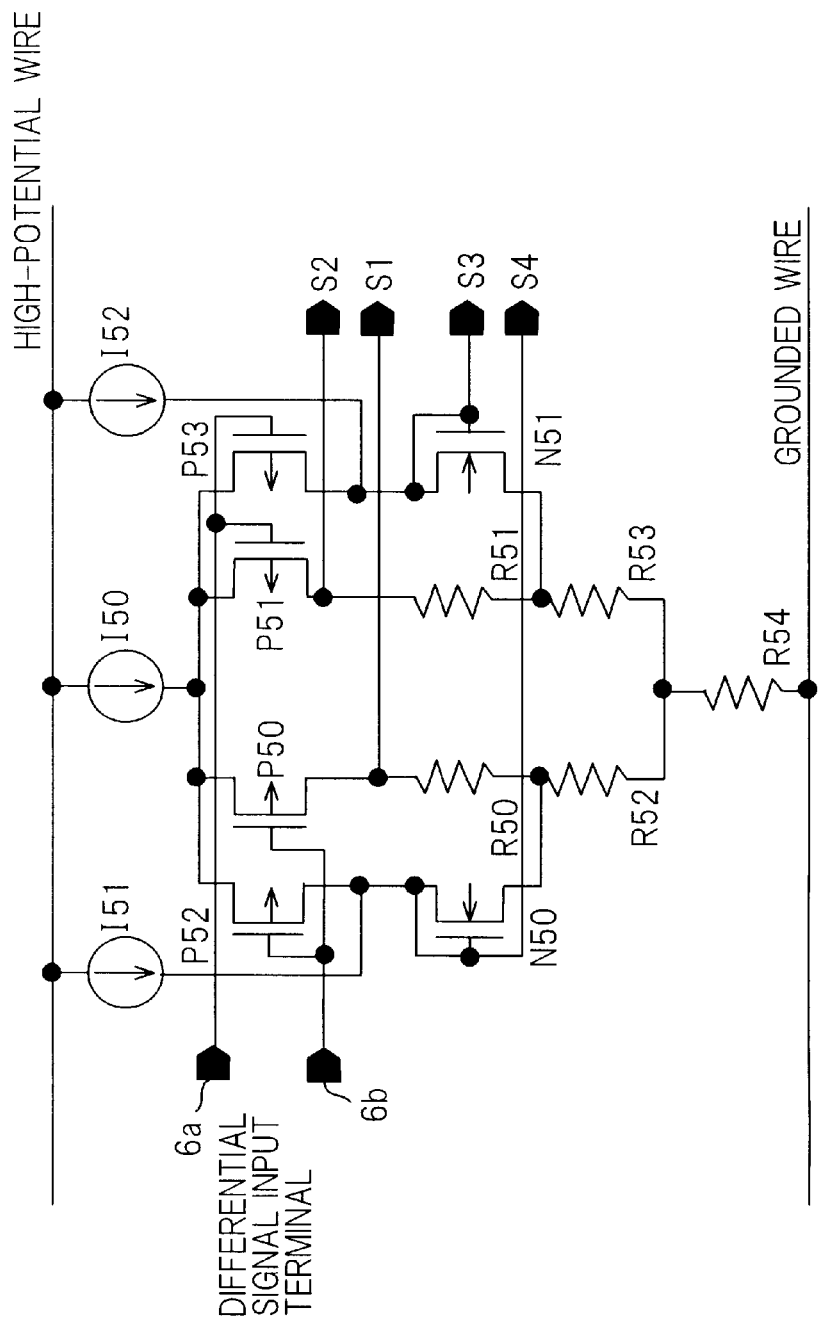
FIG. 11 shows a fourth example of the structure of a differential control signal generator.

(d) Fourth Example of the Structure of the Differential Control Signal Generator FIG. 11 shows a fourth example of the structure of the differential control signal generator. In this structure, a part of the first and second differential pairs in the third example shown in FIG. 10 are used in common. In FIG. 11, a current sources I50 corresponds to the current sources I40, I41 in FIG. 10. S1milarly, current sources I51, I52 correspond to the current sources I42, I43, a first differential pair P50, P51 to the first differential pair P40, P41, a second differential pair P52, P53 to the second differential pair P42, P43, resistors (R50+R52), (R51+R53) to the resistors R40, R41, a resistor R54 to each of the resistors R43, R46, resistors R52, R53 to the resistors R44, R45, and load resistor elements N50, N51 to the load resistor elements N40, N41.

According to the structure shown in FIG. 11, it is possible to reduce the circuit scale and the consumption power. In addition, it is possible to reduce the phase difference between each of the signals S1 to S4 to a greater extent.

In the above-described embodiments, MOS FETs are used. Alternatively, it is possible to constitute the driver circuit by using MIS FET or the like. Generally speaking, it is possible to compose a driving circuit using FETs having the opposite polarities.

As described above, according to the present invention, since a current is driven on a first current path when a positive phase control signal is H and a negative phase control signal is L, while a current is driven on a second current path when the negative phase control signal is H and the positive phase control signal is L, the leading edge and the trailing edge of an LVDS output signal become symmetric, thereby eliminating the pulse width distortion, and it is possible to cope with high-speed signal transmission.

According to the present invention, since the control signal generator is constituted by not less than two CMOS logic circuits (inverters) and a delay circuit is inserted into at least one of the CMOS logic circuit which generates a positive phase control signal and the CMOS logic circuit which generates a negative phase control signal so as to make the phase difference between the positive phase control signal and the negative phase control signal zero, it is possible to prevent the first current path and the second current path from turning on simultaneously. That is, it is possible to turn off the second current path the moment when the first current path is turned on, and to turn off the first current path the moment when the second current path is turned on, the first current path is on. As a result, it is possible to make the switching characteristics at the on/off time of the MOS transistor pair constituting the first current path and the MOS transistor pair constituting the second current path symmetric, thereby further improving the LVDS output waveform.

In addition, according to the present invention, since a first current source is provided between the source terminals of the PMOS transistor pair on the high-potential side, a second current source is provided between the source terminals of the NMOS transistor pair on the low-potential side, and each drain of the NMOS transistor pair on the low-potential side and the constant voltage source are connected by a bias resistor element, it is possible to use the NMOS transistor pair as well as the PMOS transistor pair on the low-potential side in the saturated region, to improve the switching characteristics and to reduce the pulse width deformation of the LVDS output.

Furthermore, according to the present invention, since the control signal generator is constituted by a differential amplifier to which an analog differential signal is input, and a PMOS transistor and a negative phase control signal are output from the differential amplifier, it is possible to provide a driver circuit for an LVDS inverter even when an analog differential signal is input. In this case, since it is possible to make the dc levels of the PMOS transistor pair P0, P1 on the high-potential side lower than the dc level of the NMOS transistor pair N0, N1 on the low-potential side, it is possible to lower the supply voltage.

As many apparently widely different embodiments of the present invention can be made without departing from the spirit and scope thereof, it is to be understood that the invention is not limited to the specific embodiments thereof except as defined in the appended claims.

What is claimed is:

1. A driver circuit to transmit a signal by switching the direction of a signal current which flows on a pair of transmission lines, said driver circuit comprising:

a pair of PMOS transistors as current switching elements on a high-potential side;

a pair of NMOS transistors as current switching elements on a low-potential side; and a control signal generator to generate a positive phase control signal to drive a first PMOS transistor of said PMOS transistor pair and a first NMOS transistor of said NMOS transistor pair and to input the positive phase control signal to gates of each of said first transistors, and to generate a negative phase control signal which drives a second PMOS transistor of said PMOS transistor pair and a second NMOS transistor of said NMOS transistor pair and to input the negative phase control signal to gates of each of said second transistors, wherein a drain of said first PMOS transistor is connected to a drain of said first NMOS transistor, and one of said transmission lines is connected to a portion at which said drains are connected to each other, wherein a drain of said second PMOS transistor is connected to a drain of said second NMOS transistor, and the other of said transmission lines is connected to a portion at which said drains are connected to each other, and wherein said control signal generator includes a first differential amplifier to which differential signals are input as input signals, and which outputs first differential signals to drive said PMOS transistor pair, and a second differential amplifier to which the differential signals are input and which outputs second differential signals to drive said NMOS transistor pair and outputs said positive phase control signal and said negative phase control signal from said first and second differential amplifiers.

2. A driver circuit according to claim 1, wherein
said first differential amplifier to generate said first differential signals which drive said PMOS transistor pair adopts a resistor as a load element; and,
said second differential amplifier to generate said second differential signals which drive said NMOS transistor pair adopts a resistor and a NMOS transistor with the gate and the drain connected thereto as a load element.

3. A driver circuit according to claim 2, wherein said control signal generator further includes a bias current source to constantly turn on said NMOS transistor which is used as said load element.

4. A driver circuit to transmit a signal by switching the direction of a signal current which flows on a pair of transmission lines on the basis of differential driving signals, said driver circuit comprising:
a first switch and a second switch, with the first switch having a first and second field effect transistors having opposite polarities with drains of each first and second field effect transistor being connected to each other, and with the second switch having a third and fourth field effect transistors having opposite polarities with drains of each third and fourth field effect transistor being connected to each other;
a signal generator to generate the differential driving signals wherein one of the differential driving signals is input to a gate of each of the first and second field effect transistors, and the other of the differential driving signals is input to a gate of each of the third and fourth field effect transistors;
a connection to connect drains of the first and second field effect transistors to one of said transmission line pair and to connect drains of the third and fourth field effect transistors to the other of said transmission line pair;
a constant voltage source to generate a bias voltage; and
a pair of bias resistors to respectively connect the connected first and second field effect transistor drains and the connected third and fourth field effect transistor drains to said constant voltage source.

5. A driver circuit according to claim 4, further comprising:
a first current source coupled between sources of the first and third field effect transistor and a high-potential wire, and
a second current source coupled between sources of the second and fourth field effect transistor and a low-potential wire.

6. A driver circuit to transmit a signal by switching the direction of a signal current which flows on a pair of transmission lines on the basis of differential driving signals, said driver circuit comprising:
a first switch and a second switch, with the first switch having first and second field effect transistors having opposite polarities with drains of of the first and second field effect transistors connected to each other and to a first transmission line, and with the second switch having third and fourth field effect transistors having opposite polarities with drains of the third and fourth field effect transistors connected to each other and to a second transmission line; and a signal generator to generate the differential driving signals with one of the differential driving signals input to a gate of each of the first and second field effect transistors, and the other of the differential driving signals input to a gate of each of the third and fourth field effect transistors, said signal generator including
first and second CMOS logic circuits connected to each other in series and to receive CMOS level signals as input signals, and having outputs,
a first delay circuit connected to the output of the first CMOS logic circuit to output the one of the differential driving signals, and
a second delay circuit connected to the output of the second CMOS logic circuit to output the other of the differential driving signals, where a total delay time of the second CMOS logic circuit and the second delay circuit is equal to a delay time of the first delay circuit.

7. A driver circuit according to claim 6, further comprising:
a current source coupled between sources of the first and third field effect transistors and a high-potential wire, and
a load element coupled between sources of the second and fourth field effect transistors and a low-potential wire.

8. A driver circuit according to claim 6, further comprising:
a load element coupled between sources of the first and third field effect transistors and a high-potential wire, and
a current source coupled between sources of the second and fourth field effect transistors and a low-potential wire.

9. A driver circuit to transmit a signal by switching the direction of a signal current which flows on a pair of transmission lines on the basis of differential driving signals, said driver circuit comprising:
a first switch and a second switch, with the first switch having a first and second field effect transistors having opposite polarities with drains of each first and second field effect transistor being connected to each other, and with the second switch having a third and fourth field effect transistors having opposite polarities with drains of each third and fourth field effect transistor being connected to each other;
a signal generator to generate the differential driving signals wherein one of the differential driving signals is input to a gate of each of the first and second field effect transistors, and the other of the differential driving signals is input to a gate of each of the third and fourth field effect transistors; and
a connection to connect the drains of the first and second field effect transistors to one of said transmission line pair and connecting the drains of said third and fourth field effect transistors to the other of said transmission line pair,
wherein said signal generator includes a differential amplifier to which differential signals are input as input signals, and outputs said one of the differential driving signals and said other of the differential driving signals from said differential amplifier.

10. A driver circuit according to claim 9, wherein
said signal generator further includes a pair of source follower circuits each pair having a constant current source and a field effect transistor connected in series, in which each of the differential signals output from said differential amplifier inputs to each of the source follower circuits and the source follower circuits respectively output said one of the differential driving signals and said other of the differential driving signals.

11. A driver circuit to transmit a signal by switching the direction of a signal current which flows on a pair of transmission lines on the basis of differential driving signals, said driver circuit comprising:

a first switch and a second switch, with the first switch having a first and second field effect transistors having opposite polarities with drains of each first and second field effect transistor being connected to each other, and with the second switch having a third and fourth field effect transistors having opposite polarities with drains of each third and fourth field effect transistor being connected to each other;

a signal generator to generate the differential driving signals wherein one of the differential driving signals is input to a gate of each of said first and second field effect transistors, and the other of the differential driving signals is input to a gate of each of the third and fourth field effect transistors; and a connection to connect the drains of the first and second field effect transistors to one of said transmission line pair and connecting the drains of the third and fourth field effect transistors to the other of said transmission line pair, wherein said signal generator includes a first differential amplifier to which differential signals are input as input signals and which outputs first differential signals to drive said first and third field effect transistors, and a second differential amplifier to which the differential signals are input and which outputs second differential signals to drive said second and fourth field effect transistors.

12. A driver circuit according to claim 10, wherein said first differential amplifier adopts a resistor as a load element; and said second differential amplifier adopts a resistor and a NMOS transistor with the gate and the drain connected thereto as a load element.

13. A driver circuit according to claim 11, wherein said signal generator further includes a bias current source to constantly turn on said NMOS transistor which is used as said load element.

* * * * *